United States Patent Office 3,695,887
Patented Oct. 3, 1972

3,695,887

PHOTOIMAGING MATERIAL COMPRISING POLYAMIDE

Viron V. Jones, Caldwell, N.J., assignor to Keuffel & Esser Company, Morristown, N.J.

No Drawing. Filed July 8, 1970, Ser. No. 53,276
Int. Cl. G03c *1/70*
U.S. Cl. 96—115 R 5 Claims

ABSTRACT OF THE DISCLOSURE

Alkoxy methylated polyamide resin layers are imagewise insolubilized by exposure to light in the presence of halogenated organic photoinitiator compounds. The compositions are greatly improved in light sensitivity by the addition of dyes, and exposed layers are developable by selective dissolution in unexposed areas with aqueous developer solutions to form direct images, resists, or reprographic masters.

BACKGROUND OF THE INVENTION

Photoimaging through the use of photoinitiated polymerization of ethylenically unsaturated monomers or the cross-linking of significantly unsaturated polymers has long been known and employed in the preparation of resist masters, direct reading images, and printing plates. There are described, for example, in U.S. 3,210,187 photopolymerizable compositions based upon compounds with a high degree of ethylenic unsaturation, such as acrylic esters and diacrylate vinyl monomers. These compositions include known photo-active initiators, such as benzoin or anthraquinone, yet despite their substantial unsaturation require exposure to intense ultraviolet light sources of 1800 to 2000 watts for about 20 seconds in order to effect the formation of insoluble polymer.

Other systems of image formation employ the polymerization of N-vinyl amine compounds which results from imagewise exposure of these compounds to light in the presence of organic halogen-containing compounds capable of generating halogen free-radicals upon light exposure. The use of these specific photosenitive compositions in the preparation of resists and printing plates is described in U.S. 3,046,125 and U.S. 3,485,629.

A group of polymers which have found broad usefulness where strength and wear resistance are desirable are the polyamide, or nylon, resins, particularly those types of substituted polyamides which are readily soluble in easily handled and relatively inexpensive solvents, thus providing for the ready casting of coatings and films. A class of N-alkoxy methylated polyamides having a desirable degree of solubility in alcohol has been described in U.S. 2,430,-860, inter alia; however, it has been noted that the degree of unsaturation of these compounds rendered their activity in photopolymerization reactions insufficient to be of practical merit. Such polyamides have, however, been employed with other crosslinking unsaturated compounds in an attempt to enhance the rate of photopolymerization of compositions while retaining the desirable strength and wear resistance of the polyamides.

To these ends alkoxy methylated polyamides have been reacted with esterifying agents to obtain a polyamide resin with sufficient unsaturation to be cross-linking in a usefully short time upon exposure to light. A described in U.S. 3,043,805, however, 2000 watt high pressure mercury light sources and exposures of about 10 minutes are required to effect polymerization in the presence of known polymerization initiators as benzoin methyl ether. Further, in U.S. 3,081,168 the use of alcohol soluble polyamide and polyamide interpolymers in a mixture with highly unsaturated vinyl monomers such as methylene bisacrylamide resulted in compositions requiring carbon arc light exposure of about 30 minutes with known keto compound photopolymerization initiators such as benzoin, acetophenone, and benzoyl peroxide.

SUMMARY OF THE INVENTION

It has now been discovered that the alkoxy methyl polyamide compounds referred to in the above-noted U.S. 3,043,805, as well as in U.S. Patents 2,430,910; 2,430,929; and 2,430,950, may be used directly in compositions which rapidly yield insoluble products when exposed to light when such polyamides are combined with organic halogen-containing compounds previously described as being useful in color-forming photolytic reactions with amine or dye base compounds as in U.S. 3,042,515 and 3,042,516; or as polymerization initiators for N-vinyl amines in the above noted U.S. 3,485,629; and 3,046,125.

Utilization of such halogen-containing organic photoinitiators renders unnecessary the addition of unsaturated groups to the polyamide chain as previously described and thereby yields a more highly stable photoimaging material. By the combination of one of the described class of organic halogen-containing photoactivators with a polyamide a composition is obtained which is sufficiently sensitive to light to be rendered selectively insoluble upon exposure to a 275 watt light source after a few minutes. The addition of sensitizing dyes, such as Rose Bengal, eosin and the like, has been found to increase the sensitivity of these compositions to an extent that such illumination for a period of about one minute is sufficient to initiate the insolubilizing cross-linking of the polyamide resin. It has additionally been found that the systems are further increased in photolytic sensitivity when exposed to light at a temperature in the range of about 60–130 degrees centigrade.

In the practice of the present invention a coating composition is prepared in the form of an alcohol solution of the alkoxy methyl polyamide with the halogen-containing organic photoactivator and a sensitizing dye, and a coating thereof is cast upon a suitable support and dried. Imagewise light exposure, preferably at a temperature substantially above room temperature, initiates the insolubilizing cross-linking reaction in light-exposed areas of the coating.

As a useful adjunct to the present invention, it has further been discovered that the cross-linking reaction thus photolytically initiated may be carried through to completion by simple heating, for example in the range of about 60–130 degrees centigrade. Thereafter, the application to the coating of a solvent for the polyamide, such as the original alcohol solvent or an aqueous solution of sodium salicylate, or bromal or chloral hydrate, removes unexposed areas of the coated layer. The insolubilized polyamide resin image remaining on the surface of the support may thereafter be employed in the usual manner as a printing master or a master resist for the etching of the support. In addition, when the polyamide composition incorporates distinctly colored materials the image may be employed as such as a reproduction of the original, or if the coloring matter is actinically opaque, the resulting image may be used as a photographic reproduction master.

The photoimaging materials of the present invention comprise basically a layer of an alkoxy methylated polyamide resin having incorporated therein an organic halogen-containing photoactivator compound generally of the type which generates halogen free-radicals upon exposure to light. Depending upon the ultimate intended use, these materials may be prepared in the form of self-supporting films or as coatings upon any of numerous available supports. Thus, papers, or opaque substrates may be employed in the preparation of materials to be utilized in direct imaging, transparent supports may be employed in the preparation of photographic reproduction masters, and hydrophilic surfaces may be utilized in the normal manner for the preparation of lithographic printing plates. When employed as resists in stenciling or chemical milling processes, the coating may be applied to appropriate porous or etchable substrates.

Any of the numerous alkoxy methyl polyamide resins previously noted may be employed in the combinations of the present invention. A particularly desirable and well suited polymer is the alcohol-soluble methoxy methyl polyhexamethylene adipamide having a molecular weight in the range of 8,000 to 10,000. Useful resins of this composition have been described as having a methoxy methyl substitution in the range of about 10% to 45% of the available amine groups, a particularly useful material having such a substitution range of about 34% to 38%.

Organic halogen-containing compounds comprising the photoactivators in the present invention have generally been characterized in the art as being capable of generating halogen free-radicals upon exposure to light. Whether the utility of these compounds as photoactivators for the photolytic insolubilization of the noted nylon resins is due primarily to the action of such halogen free-radicals or to the secondary formation of strong acids is not definitely known, but it has been found that a significant number of many types of these organic halogen-containing compounds are effective in the present invention. Particularly useful are the brominated derivatives of these compounds such as carbon tetrabromide; hexabromoethane; pentabromoethane; bromal; w,w,w-tribromoquinaldine; w,w,w-tribromoacetophenone; 4,a,a-tribromoacetophenone; tribromomethyl phenyl sulfone; 5,5-dibromobarbituric acid and many additional organic bromine compounds which can readily be prepared by the direct bromination of active methylene groups, i.e. substitution at the carbon adjacent to the two carbonyl groups such as found in malonic ester; acetoacetic ester; indandione; 1,3-diphenyl propandione; dimedone; 2,4-pentanedione; and also lesser reactive methylene groups as in 4,4-dimethoxy-2-butanone; and phenyl-2-propanone. The amount of halogenated compounds in the compositions is not critical; however, since the light-sensitivity is clearly related to the presence of the halogen-containing activators, it is advantageous to include a solution-saturating amount of such compounds. The use of combinations of activators is useful to overcome solvency limitation.

The combination of the nylon polymer and the halogenated photoactivator have been found to be sufficient alone to effect insolubilizing cross-linking upon exposure to moderate illumination which in the present utilization amounts to that achieved by the output of a 275 watt sunlamp at a distance of about 6 inches. In comparison to the extended carbon arc or high pressure mercury lamp exposures previously required of polyamide resin compositions, a few minutes of illumination to such a moderate light source is sufficient to provide sharply defined solubiilty differences which may readily be developed to useful images by the application of solvents for the unexposed composition. The photolytic activity of the combination of polyamide and organic halogen-containing activator can be substantially enhanced, thus greatly increasing the photosensitivity of the composition, by the incorporation of any of the numerous sensitizing dyes typically employed in photographic systems, particularly those dyes which are of a photo-reducible nature such as eosin Y (C.I. 45380), Rose Bengal (C.I. 45440), erythrosine B (C.I. 45430), bromphenol blue, and pararoseaniline. Through the use of such sensitizing dyes, five-fold increase in sensitivity under the noted illumination is not uncommon.

The process of imaging with the materials of the present invention generally comprises the imagewise illumination of the layer of photosensitive composition thereby generating active halogenation in the exposed areas. Subsequent overall heating of the exposed layer carries the insolubilizing cross-linking reaction forward to completion in the areas of substantially greater halogen acid or free-radical concentration defined by the light exposure.

While the temperature and time during which the post-exposure heating is carried out are not critical; temperatures sufficient to decompose the halogen-containing photoactivator and thereby precipitate vagrant insolubilizing cross-linking should be avoided. Thus, effective developing temperatures may be readily obtained from heated platens, hot gases, or radiant sources, and such temperatures generally in the range of about 60–130 degrees centigrade are useful in carrying forth the insolubilized reaction in a substantially short time. As an alternative to a process including a post-exposure heating step, imagewise heating alone or in conjunction with light exposure may be employed to carry the cross-linking reaction to completion. Light sources emitting a high proportion of heat radiation may thus be used alone to provide the desired degree of image insolubility. Such applications, however, are excessively time consuming and do not reflect a practical utilization of light-exposure equipment.

Upon completion of the cross-linking, the exposed and post-heated layer is treated with a solvent for the unexposed areas of the layer and may thus comprise a solvent originally employed in the preparation of the coatable composition. The original selection of alcohol soluble polyamide resins is therefore of added advantage, since the developing step can easily be accomplished with relatively innocuous and non-flammable fluids. In addition to the use of such prime solvents, aqueous solutions of sodium salicylate, bromal hydrate or chloral hydrate have been found to be effective developers for the alkoxy methyl polyamide resins.

A particularly high sensitivity is achieved with the materials of the present invention when the layer is heated to a temperature in the previously noted range of 60–130° C. during the exposure to the light image. Such concurrent heating effects a ten-fold increase in the light-sensitivity and may readily be accomplished by conductive heating of the layer or through the use of radiant heating over the whole of the layer or in selective parts through thermographic means during the imagewise light-exposure step.

A further and remarkable increase in sensitivity can be achieved to the extent of rendering the compositions of the present invention capable of imaging at projection speeds, that is through the use of 500 watt incandescent light sources attenuated by enlarging optics, when unsaturated cross-linking agents such as methylene bisacrylamide are included in the coating composition.

PREFERRED EMBODIMENTS

Example 1

A solution was prepared of:

N-methoxy methyl polyhexamethylene adipamide (34–38% methoxy methyl substitution)—1.0 gm.
Carbon tetrabromide—0.5 gm.
Eosin Y—0.02 gm.
Methanol—10.0 ml.

The solution was coated on a polyethylene terephthalate film and air dried to a layer thickness of 0.25 mil. The resulting coated film material was exposed for one minute at room temperature through a line negative original to the light of a 275 watt G.E. sunlamp at a distance of about 6 inches. The exposed material was oven-heated for one minute at a temperature of about 90° C. Subsequent swabbing of the coated layer with a 15% aqueous solution of sodium salicylate resulted in removal of the unexposed areas of the coating and the formation of a distinct relief image of the original.

Example 2

The composition of Example 1 was coated on a grained aluminum sheet commonly used in the preparation of offset printing plates and exposed, treated, and developed as in Example 1. The imaged sheet was readily inked and formed clear printed images on ordinary paper.

Example 3

A solution was prepared as in Example 1, except for the substitution of a solution-saturating amount of tribromomethyl phenyl sulfone for the carbon tetrabromide. When coated, exposed and treated as was the material of Example 1, a distinct image of the original was obtained.

Examples 4–10

Solutions were prepared as in Example 2 with substitution of each of the following organic halogen-containing initiators for the carbon tetrabromide:

(4) iodoform
(5) w,w,w-tribromoquinaldine
(6) 4,a,a-tribromoacetophenone
(7) w,w,w-tribromoacetophenone
(8) hexabromoethane
(9) pentabromoethane
(10) bromal Coatings were prepared according to Example 1, and similar exposure and treatment of the resulting materials yielded good relief images of the original.

Example 11

Solutions were prepared as in Example 1 with substitution of the following dyes for cosin Y:

| | |
|---|---|
| erythrosine B | bromphenol blue |
| Rose Bengal | pararoseaniline |

Coatings were prepared according to Example 1, and similar exposure and treatment of the resulting materials yielded good relief images of the original.

Example 12

A suspension of 1.5 gm. (0.01 mole) of 1,3-indandione in 20 ml. carbon tetrachloride was gently boiled under reflux, and 3.2 gm. (0.02 mole) of bromine in 5 ml. of carbon tetrachloride was added dropwise to the boiling mixture. After addition of the bromine and expiration of generated hydrogen bromide, the reaction mixture was evaporated to dryness and the residue recrystallized from carbon tetrachloride to yield 3.0 gm. of 2,2-dibromoindandione. A solution was prepared as in Example 1, substituting 2,2-dibromoindandione for the carbon tetrabromide. A coating was similarly prepared and the resulting material exposed to the light source and treated in like manner to obtain a good relief image of the original.

Examples 13–16

The procedures of Example 12 were employed to prepare good relief images with material incorporating the bromination products of:

(13) 1,3-diphenylpropandione
(14) 4,4-dimethoxy-2-butanone
(15) 2,6-dimethyl-3,5-heptandione
(16) phenyl-2-propanone Example 17

A solution was prepared as in Example 1 with the substitution of 0.25 gm. of monobromo diphenyl propandione and 0.25 gm. of 4,a,a-tribromoacetophenone for the carbon tetrabromide.

The resulting solution was used to prepare coated material as in Example 1 and was exposed at room temperature in like manner for 2.5 minutes. Oven treatment at 90° C. for one minute and development with the sodium salicylate solution provided a clear relief image.

Example 18

The coated material of Example 17 was exposed to the light image for 15 seconds while maintained in contact with a glass plate heated to 90° C. and was thereafter treated and developed as in Example 17. The resulting relief image was equal in definition to the image of Example 17.

Example 19

The coated material of Example 1 was light-exposed as there-described for one minute and was then oven-heated at 130° C. for a period of 10 seconds. Development with the sodium salicylate solution resulted in a relief image having definition equal to the image of Example 1.

Example 20

A solution was prepared of:

| | Gm. |
|---|---|
| Polyamide of Example 1 | 1.0 |
| N,N'-methylene bisacrylamide | 0.15 |
| Carbon tetrabromide | 0.5 |
| Rose Bengal | 0.02 |
| Methanol | 10 |

The solution was used to prepare a coated material as in Example 1. Exposure of the material at room temperature for 15 seconds to the light image of Example 1 (distance six inches) and subsequent treatment and development as in Example 1 resulted in a good relief image.

Example 21

The material of Example 20 was exposed to the light image for 2 seconds while in contact with a glass plate at a temperature of 65° C. Subsequent treatment and development as in Example 20 resulted in an image of equal definition to that obtained in Example 20.

Example 22

The material of Example 20 was exposed to a line image from a 300 watt commercially-available slide projector at a distance of 36 inches. After a 15 second exposure while at a temperature of 70° C., the material was treated and developed as in Example 20 with a resulting image of definition to that of Example 20.

For comparison, a material was prepared by substituting for the carbon tetrabromide of Example 20, the benzophenone photoactivator described in Example 43 of U.S. Pat. 3,081,168. An exposure of about 8 minutes in the present apparatus was required to obtain a legible image.

What is claimed:

1. Photoimaging material comprising a support and a light-sensitive coating thereon of a composition consisting essentially of:

(a) an alkoxy methyl polyamide having a degree of alkoxy methylation between about 10% and 45%;
(b) a light-sensitive halogen-containing photoactivator capable of generating halogen free-radicals upon exposure to light; and
(c) a photosensitizing dye.

2. Material according to claim 1 wherein said polyamide is a methoxy methyl polyhexamethylene adipamide having a molecular weight between about 8,000 and 10,000.

3. Material according to claim 2 wherein said polyamide has a degree of methoxy methylation between about 34% to 38%.

4. Material according to claim 1 wherein said photoactivator is a source of bromine free-radicals.

5. Material according to claim 4 wherein said photoactivator is a brominated keto compound.

References Cited

UNITED STATES PATENTS

| | | | |
|---|---|---|---|
| 3,495,987 | 2/1970 | Moore | 96—115 |
| 3,060,023 | 10/1962 | Burg et al. | 96—28 |
| 3,043,805 | 7/1962 | Burg | 260—72 |

RONALD H. SMITH, Primary Examiner

U.S. Cl. X.R.

96—35.1